(12) United States Patent
Chen (10) Patent No.: US 8,184,491 B2
(45) Date of Patent: May 22, 2012

(54) METHOD FOR READING MEMORY CELL

(75) Inventor: Frederick T Chen, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 375 days.

(21) Appl. No.: 12/542,199

(22) Filed: Aug. 17, 2009

(65) Prior Publication Data

US 2011/0038216 A1 Feb. 17, 2011

(51) Int. Cl.
*G11C 7/00* (2006.01)
*G11C 11/14* (2006.01)
*G11C 11/00* (2006.01)

(52) U.S. Cl. ............... 365/189.15; 365/171; 365/163; 365/148

(58) Field of Classification Search ............. 365/189.15, 365/171, 163, 148
See application file for complete search history.

(56) References Cited

U.S. PATENT DOCUMENTS

| | | | |
|---|---|---|---|
| 5,341,328 A | 8/1994 | Ovshinsky et al. | |
| 5,359,205 A | 10/1994 | Ovshinsky | |
| 5,414,271 A | 5/1995 | Ovshinsky et al. | |
| 5,534,712 A | 7/1996 | Ovshinsky et al. | |
| 6,768,665 B2 * | 7/2004 | Parkinson et al. | 365/113 |
| 2008/0266942 A1 | 10/2008 | Jeong et al. | |
| 2009/0016099 A1 | 1/2009 | Jeong et al. | |
| 2009/0016100 A1 | 1/2009 | Jeong | |

OTHER PUBLICATIONS

Karpov et al., "Fundamental drift of parameters in chalcogenide phase change memory," J. Appl. Phys., 102, 124503, USA,w (2007).

* cited by examiner

*Primary Examiner* — Alexander Sofocleous
*Assistant Examiner* — Hai Pham (57) ABSTRACT

Methods for reading a memory cell are provided. The method for reading a memory cell includes applying a first read pulse to a memory cell, heating the memory cell to a first temperature and obtaining a first read data. The first read data is converted to a first digital data. The first digital data is stored in a shift register. A second read pulse is applied to the memory cell, heating the memory cell to a second temperature and obtaining a second read data. The second read data is converted to a second digital data. The second digital data is stored in the shift register. A ratio of the first digital data and the second digital data is calculated, obtaining a quotient. The quotient is converted to an analog value. A log amplifier circuit takes the log of the analog value, representing an activation energy state.

13 Claims, 9 Drawing Sheets

METHOD FOR READING MEMORY CELL

BACKGROUND OF THE INVENTION

1. Field of the Invention

The invention relates to a method for reading a memory cell, and more particularly to a method for stably reading a memory cell.

2. Description of the Related Art

Demand for semiconductor memory devices (or memory devices) have increased because of their advantages. Of the different types of memory devices, magnetic random access memory (MRAM), resistive random-access memory (RRAM), and phase change memory (PCM) have random accessibility, higher integration and greater capacity storage when compared to other memory devices.

A phase change memory (PCM) or phase-change random access memory (PRAM) is based on a volume of chalcogenide alloy, which, after being heated and cooled, adopts one of two stable, but programmable, phases: a crystalline state or an amorphous state. The key to the phase-change memory is the chalcogenide material. The device historically includes an alloy of germanium (Ge), antimony (Sb) and tellurium (Te), which is referred to commonly as a GST alloy. The material is particularly useful for incorporation in a memory device because of its ability to switch rapidly, when heated and cooled, between the stable amorphous and crystalline phases.

For materials used in PCMs or PRAMs, resistance of a first phase, i.e., a crystalline phase, is relatively low, and the resistance of a second phase, i.e., the amorphous phase, is relatively high. The state of the cell is programmed to a logical one (1) or zero (0), depending upon the phase of the programmable volume, and measured resistance. The crystalline state is commonly referred to as the "set", or "0", state and the amorphous state is commonly referred to as the "reset", or "1", state.

Recently, a technique for storing more than 2-bit data in one memory cell has been disclosed. This type of memory cell is generally referred to as a multi-level cell (MLC). A multi-level phase change memory device is a low-cost non-volatile memory device having high memory capacity. In a multi-level phase change memory device, there are intermediate states between a reset state and a set state.

Figure 1:
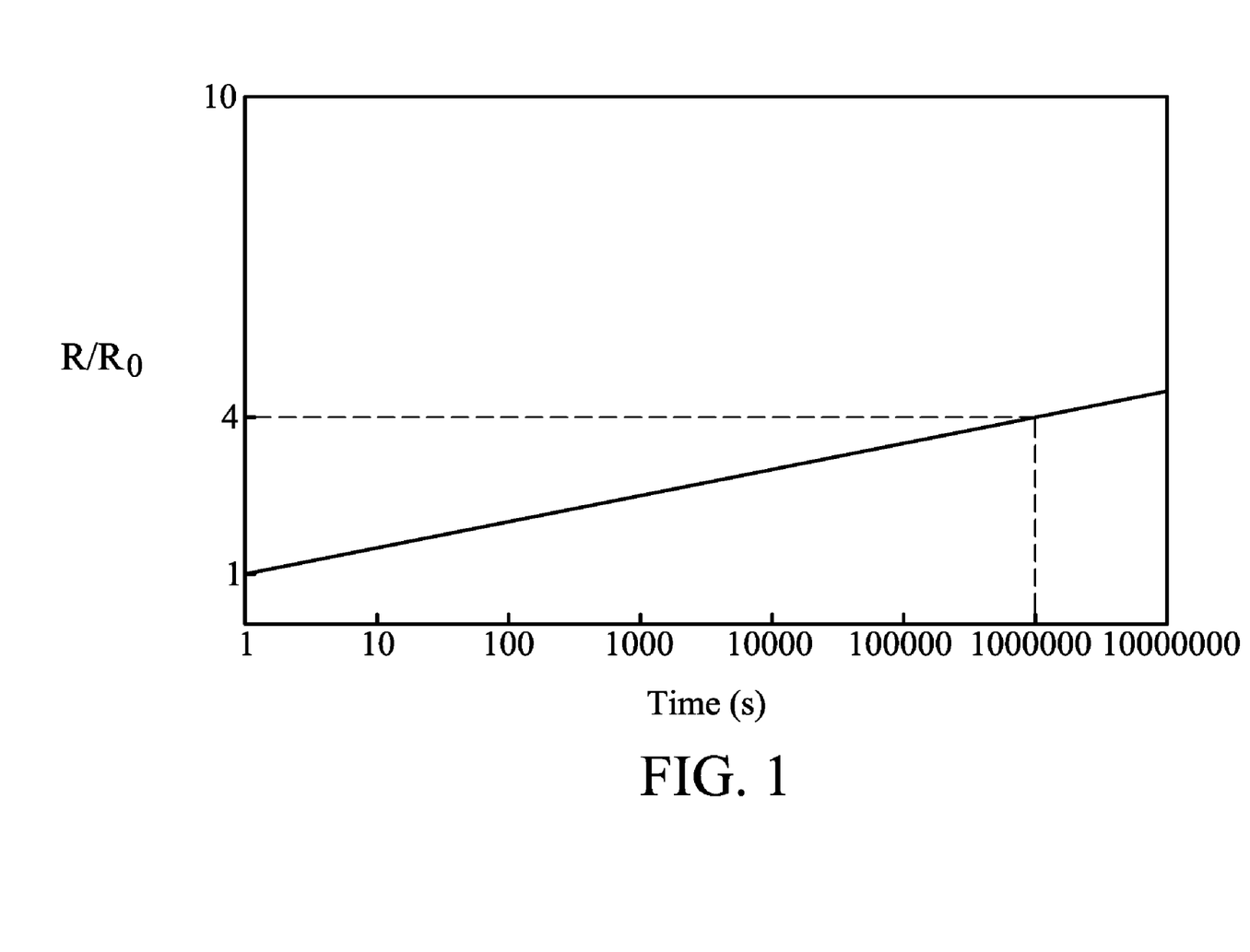
FIG. 1 shows a graph plotting the resistance against the time of the chalcogenide containing amorphous material.

However, for multi-level phase change memory devices including chalcogenide containing amorphous material, the resistance of the chalcogenide containing amorphous material drifts upward over time (e.g., following the power law $(t/t_0)^r$, with r~0.1), as much as a factor of 4, within $10^6$ seconds, as shown in FIG. 1 and disclosed in Karpov et al., J. Appl. Phys. 102, 124503 (2007). This poses a problem for operation of the multi-level phase change memory device, where two adjacent resistance states may need to be separated by a factor of 1.5-2.

Figure 2:
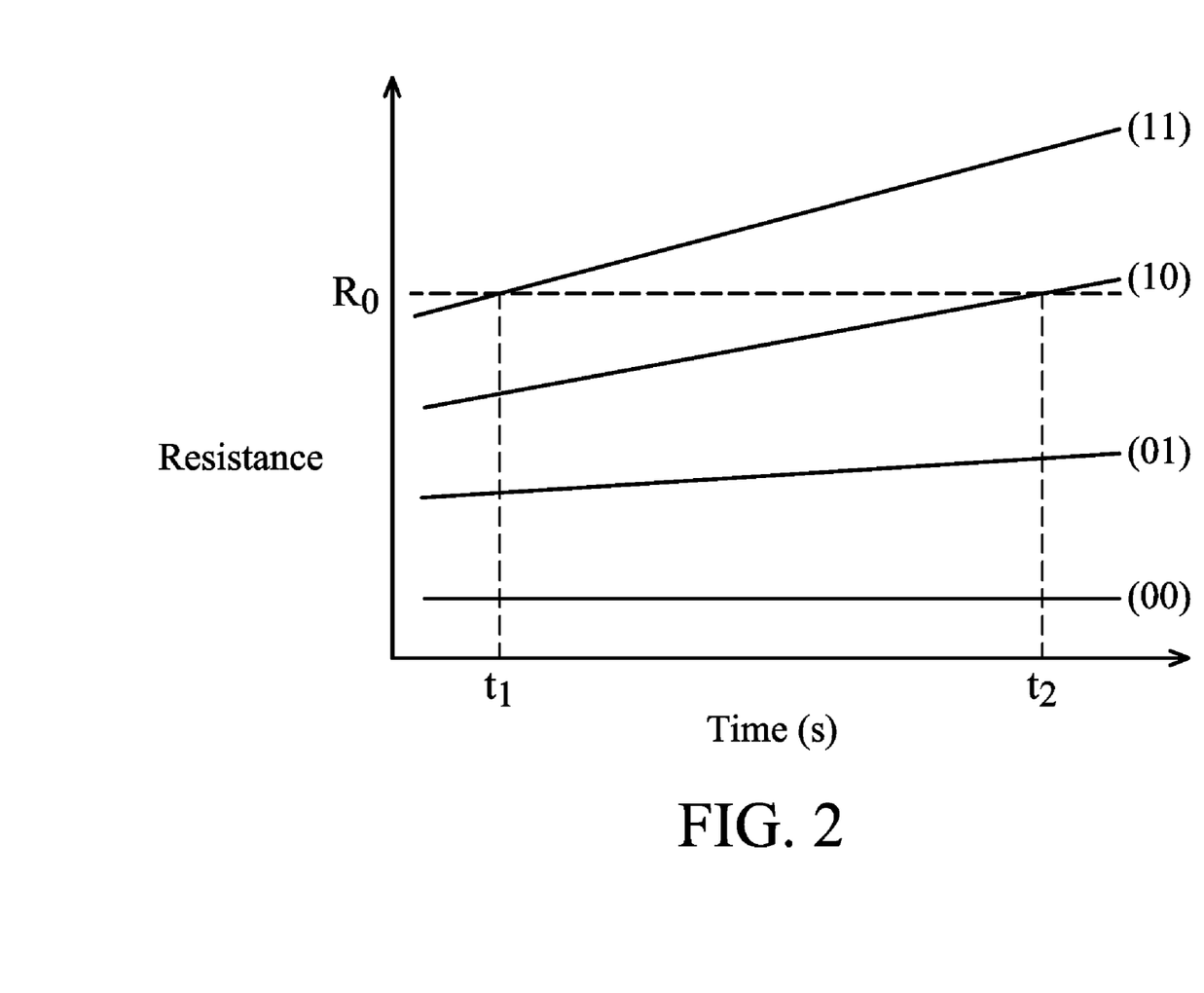
FIG. 2 shows a graph plotting resistance against time of a multi-level phase change memory cell in which data are programmed into a state 11, a state 10, a state 01 and a state 00, according to a conventional method for reading a memory cell.

FIG. 2 is a graph illustrating time against resistance of a multi-level phase change memory cell in which data are programmed into a state 11, a state 10, a state 01 and a state 00. The freshly programmed resistance state 11 of a resistance $R_0$ at time $t_1$ would be confused with the resistance state 10 that was programmed at time $t_2$. For this reason, the operation of multilevel phase change memory as high bit density technology is prohibited unless a different method of operation avoiding the drift consequence is used. It should also be noted that other non-volatile resistance-based memories based on materials such as $TiO_2$, are also vulnerable to resistance drift (e.g., B. J. Choi et al., J. Appl. Phys. 98, 033715 (2005)).

U.S. Pat. Pub. 2009/0016100 discloses a phase change memory device and a reading method thereof. The method programs a reference array along with a read/write block. However, the read/write operation and required structure result in excess time and power consumption as well as extra chip area, leading to higher manufacturing cost.

BRIEF SUMMARY OF THE INVENTION

An exemplary embodiment of a method for reading a memory cell is provided. The method for reading a memory cell includes applying at least two successive read pulses to a memory cell, obtaining at least two read data; and subsequently determining the activation energy via the at least two read data.

Another exemplary embodiment of a method for reading a memory cell is provided. The method for reading a memory cell includes applying a first read pulse to a memory cell, heating the memory cell to a first temperature and obtaining a first read data. The first read data is converted to a first digital data. The first digital data is stored in a shift register. A second read pulse is applied to the memory cell, heating the memory cell to a second temperature and obtaining a second read data. The second read data is converted to a second digital data. The second digital data is stored in the shift register. A ratio of the first digital data and the second digital data is calculated, obtaining a quotient. The quotient is converted to an analog value. A log amplifier circuit takes the log of the analog value, representing an activation energy state.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

A memory cell such as a phase change memory cell stores information as a state. This state is characterized not only by electrical resistance but also by activation energy ($E_a$). An embodiment of the invention provides a method for reading state information by determining the activation energy thereof, reducing read errors causing from resistance time drift during a read operation.

The invention avoids the above-mentioned resistance drift by relying on determining activation energy ($E_a$) as the method of reading information. The activation energy and the memory cell state resistance can be determined according to the following equation:

$$R = A \exp(E_a/kT),\qquad \text{Equation (I)}$$

wherein, A is a normalizing factor, Ea is the activation energy, k is the Boltzmann constant and T is the absolute Kelvin temperature. The activation energy is an indicator of the mixture of amorphous and crystalline composition in the phase change material. Further, the memory cell state resistance can be also determined by the following equation:

$$R = A \exp([E_0 + kTv \ln(t/t_0)]/kT),\qquad \text{Equation (II)}$$

wherein, A is a normalizing factor, $E_0$ is the activation energy in crystalline state, k is the Boltzmann constant, T is the absolute Kelvin temperature, t and $t_0$ are time, and v is drift coefficient. Therefore, the activation energy of the amorphous/crystalline mixture state can be identified according to the following equation:

$$Ea = E_0 + kTv \ln(t/t_0).\qquad \text{Equation (III)}$$

In a typical phase change memory cell operation at room temperature, kT is approximated as 0.026 eV, v is approximated as 0.1, $E_0$ is approximated as 0.2 Ev, and to is 1 second. Accordingly, the activation energy of the crystalline state and amorphous/crystalline mixture state is determined according to the following equation:

$$Ea \approx 0.2\ eV + 0.0026\ eV \times \ln(t/1).\qquad \text{Equation (IV)}$$

Figure 3:
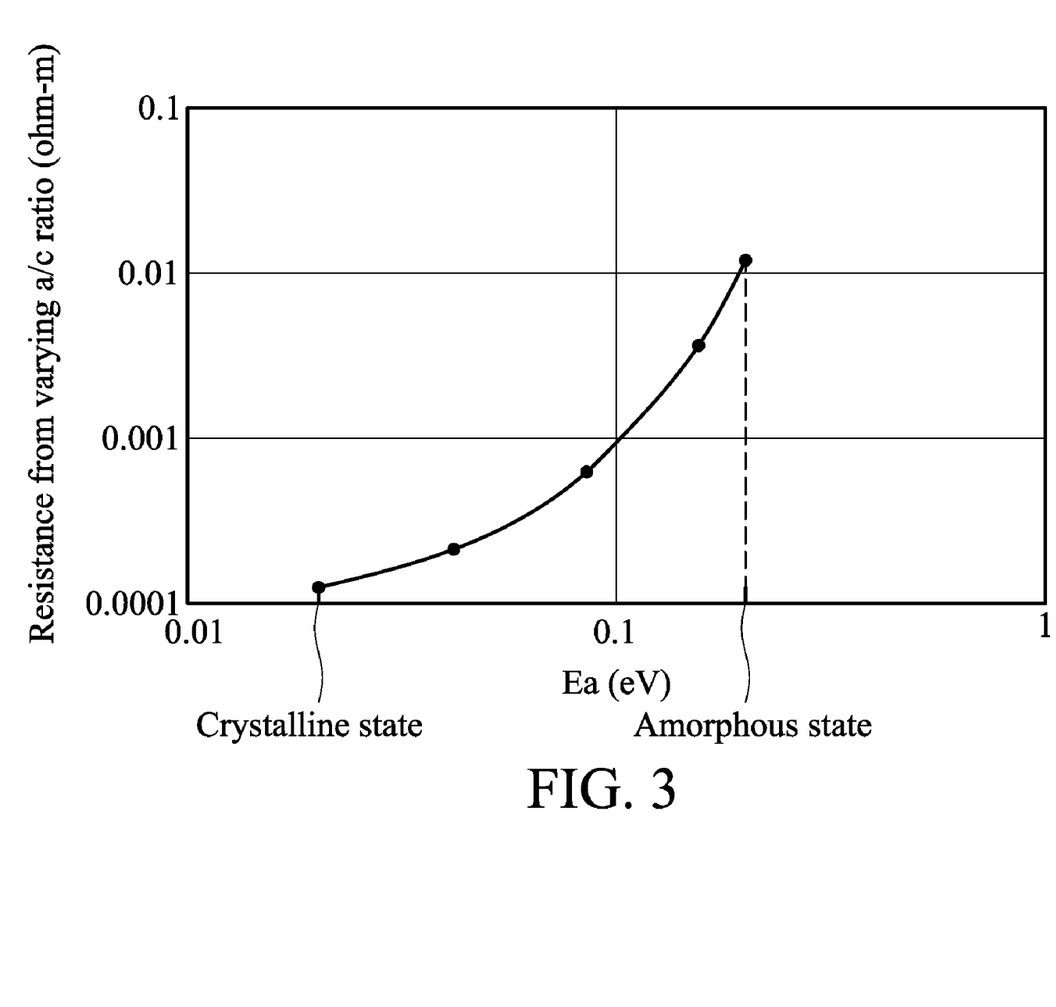
FIG. 3 shows a graph plotting the resistance from varying amorphous/crystalline (a/c) ratio against the activation energy of an embodiment of the invention.

For a typical phase change memory based on Ge2Sb2Te5 (GST), the activation energy of the crystalline state is approximated as 0.02 eV and the activation energy of the amorphous state is approximated as 0.2 eV. The activation energy between an amorphous/crystalline mixture state is illustrated in FIG. 3. As shown in FIG. 3, each amorphous/crystalline mixture state (with different amorphous/crystalline (a/c) ratio) has corresponding and no overlapped activation energy.

Operation of activation energy inherently results in less time drift than resistance due to the following. From the Equation (I): $R = A \exp(Ea/kT)$, the following equation can be derived:

$$1/Ea \times dEa/dt = (kT/Ea) \times 1/R \times dR/dt,\qquad \text{Equation (V)}$$

wherein, t is time, and R is resistance,

Thus, the logarithmic rate of change of Ea is a factor of kT/Ea smaller than that of R. In embodiments of the invention, the method to determine activation energy requires two successive resistance readings (obtaining resistances $R_1$ and $R_2$), one after the other, but at two different temperatures (first temperature $T_1$ and second temperature $T_2$) resulting from two different read power inputs. According to the above description and the Equation (V), the relationship between $R_1$ and $R_2$ can be represented by the following equation:

$$R_1/R_2 = \exp[Ea/k \times (1/T_1 - 1/T_2)],\qquad \text{Equation (VI)}$$

$$\text{i.e. } \ln(R_1/R_2) = Ea/k \times (1/T_1 - 1/T_2).\qquad \text{Equation (VII)}$$

Regarding Equation (VII), the log ratio ($\ln(R_1/R_2)$) is in direct proportion to the activation energy (Ea), represented by the following equation:

$$\ln(R_1/R_2) \propto Ea.\qquad \text{Equation (VIII)}$$

Figure 4:
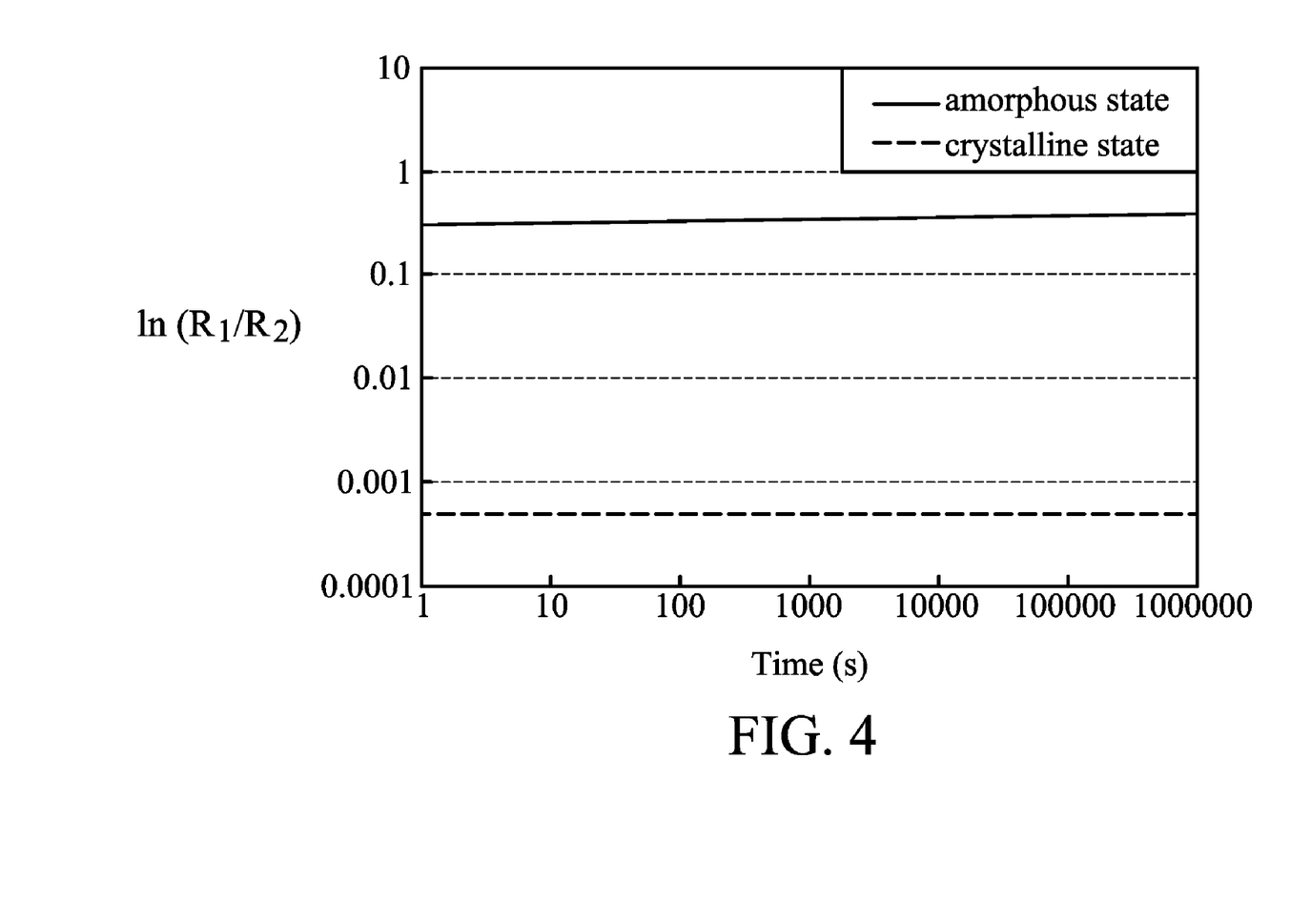
FIG. 4 shows a graph plotting the log ratio ($\ln(R_1/R_2)$) against time of an embodiment of the invention.

For the crystalline state, the log ratio ($\ln(R_1/R_2)$) is approximated as 0. For the amorphous state, in a worst case, the log ratio ($\ln(R_1/R_2)$) ranges from 0.3 to 0.4 (wherein Ea is approximated as 0.2 Ev, and $T_1$ is 380K and $T_2$ is 400K), as shown in FIG. 4. As result, the activation energy drift factor ($\leqq 30\%$) is much less than the resistance drift factor (~4).

As shown in FIG. 2, if the resistance of state 10 at time $t_2$ ($R_{10}(t_2)$) is equal to the resistance of state 11 at time t1, reading errors occur. Accordingly, if the activation energy of state 10 at time $t_2$ $Ea_{10}(t_2)$ is not equal to or exceeds the activation energy of state 11 at time $t_1$ $Ea_{11}(t_1)$, reading errors would not occur. In an embodiment of the invention, a multi-level phase change memory cell, in which data are programmed into a state 11, a state 10, a state 01 and a state 00, is provided. The resistance of state 10 at time $t_2$ ($R_{10}(t_2)$) and the resistance of state 11 ($R_{11}(t_1)$) at time t1 can be determined according to the following equations:

$$R_{11}(t_1) = A_{11} \exp(Ea_{11}(t_1)/kT),\qquad \text{Equation (IX)}$$

$$R_{10}(t_2) = A_{10} \exp(Ea_{10}(t_2)/kT).\qquad \text{Equation (X)}$$

When the resistance of state 10 at time $t_2$ ($R_{10}(t_2)$) is equal to the resistance of state 11 at time $t_1$ ($R_{11}(t_1)$), the relationship between the activation energy of state 10 at time $t_2$ $Ea_{10}(t_2)$ and the activation energy of state 11 at time t1 $Ea_{11}(t_1)$ can be determined according to the following equation:

$$A_{11} \exp(Ea_{11}(t_1)/kT) = A_{10} \exp(Ea_{10}(t_2)/kT).\qquad \text{Equation (XI)}$$

After taking log of both sides, Equation (XI) can be expressed according to the following equation:

$$\ln A_{11} + Ea_{11}(t_1)/kT = \ln A_{10} + Ea_{10}(t_2)/kT,\qquad \text{Equation (XII)}$$

$$\text{i.e. } kT[\ln A_{11} - \ln A_{10}] = Ea_{10}(t_2) - Ea_{11}(t_1).\qquad \text{Equation (XIII)}$$

From the calibrations measured from PCM resistivity (as shown in FIG. 3), $A_{00}, A_{01}, A_{10},$ and $A_{11}$ have the following relationship therebetween:

$$A_{00}(\text{crystalline state}) = 5.5545e^{-5}\ \text{ohm-m} > A_{01} > A_{10} > A_{11}(\text{amorphous state}) = 4.5e^{-6}\ \text{ohm-m}\qquad \text{Equation (XIV)}$$

At the melting point (~900 K for GST), the resistivities should converge. As a result, $A_{00}$ should be greater than $A_{11}$ to make up for the activation energy. Since $A_{11} < A_{10}$, the Equation (XIII): $kT[\ln A_{11} - \ln A_{10}] = E_{a10}(t_2) - E_{a11}(t_1) < 0$.

Figure 5:
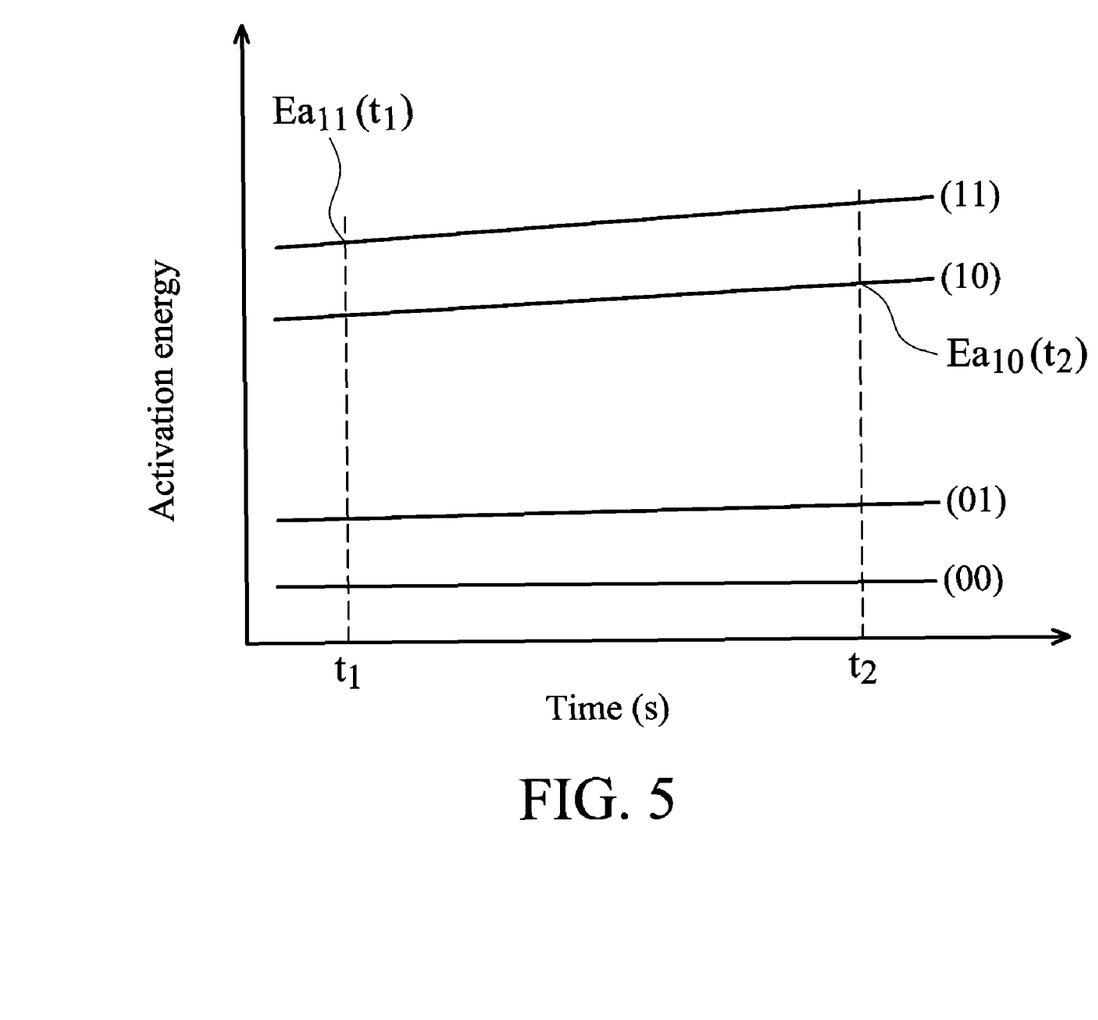
FIG. 5 shows a graph plotting activation energy against time of a multi-level phase change memory cell in which data are programmed into a state 11, a state 10, a state 01 and a state 00, according to a method for reading a memory cell disclosed in an embodiment of the invention.

The negative difference means $E_{a10}(t_2)$ has not yet crossed over to match $E_{a11}(t_1)$. The result is shown in FIG. 5.

Figure 6:
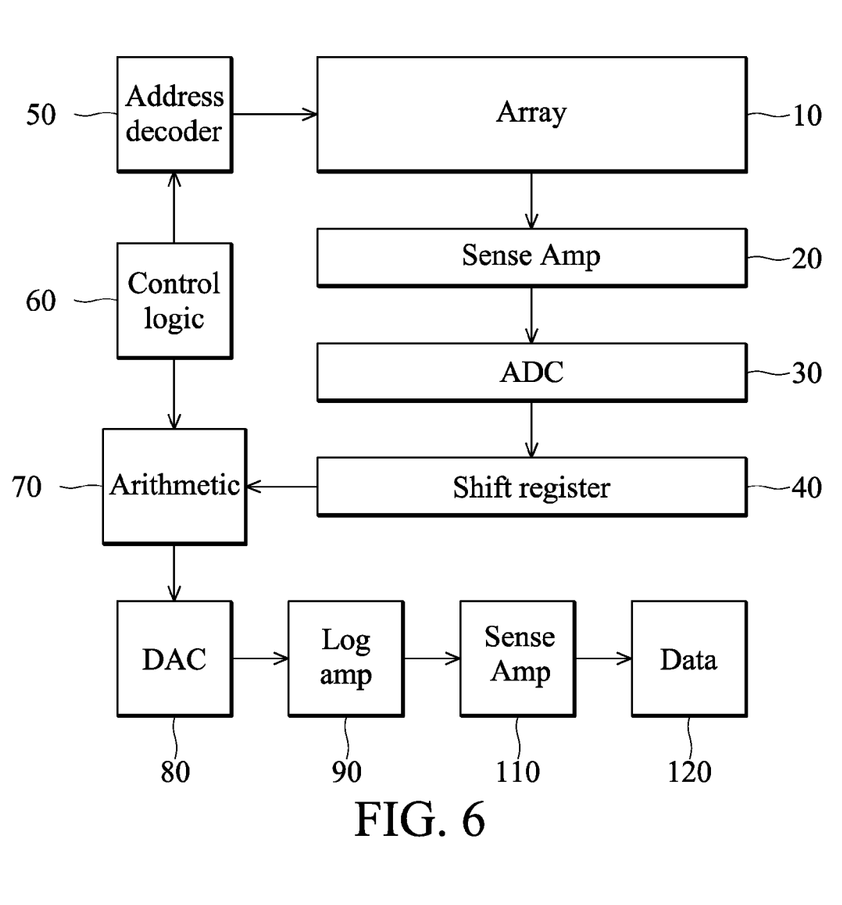
FIG. 6 shows a block diagram of a multi-level memory device according to an embodiment of the invention.

FIG. 6 shows a block diagram of a multi-level phase change memory device 100 according to an example embodiment. As shown in FIG. 6, the array 10 may include a plurality of memory cells storing multi-bit data in a sense amplifier circuit (as shown as SA) 20. Although not illustrated in the drawings, a plurality of memory cells may be arranged in rows (i.e., along word lines) and columns (i.e., along bit lines). The sense amplifier circuit 20 may sense data of selected memory cells during a read operation. The sense amplifier circuit 20 provides an analog output signal to an analog-to-digital converter (shown as DAC) 30 to enable it to produce a digital output signal stored in a shift register 40. The shift register 40 is reset with the first signal, and sequentially shifts the m-bit data from stage to stage in response to the second signal. An arithmetic unit 70 is used to calculate a ratio of the digital data provided by the shift register 40, obtaining a quotient (digital data). A digital-to-analog converter 80 converts the quotient to an analog value. A log amplifier circuit 90 (shown as Log Amp) takes the log of the analog value, representing an activation energy state into a data unit 120 via a sense amplifier circuit (shown as SA) 110. The log amplifier can be, for example, an operational amplifier in parallel with a diode and in series with a resistor. An address decoder 50 may decode an externally provided address and provide the decoded address to a selection circuit (not shown) to select a word line and bit line of at least one memory cell during a write or read operation. Further, the address decoder 50 and the arithmetic unit 70 may be controlled by a control logic 60.

Figure 7:
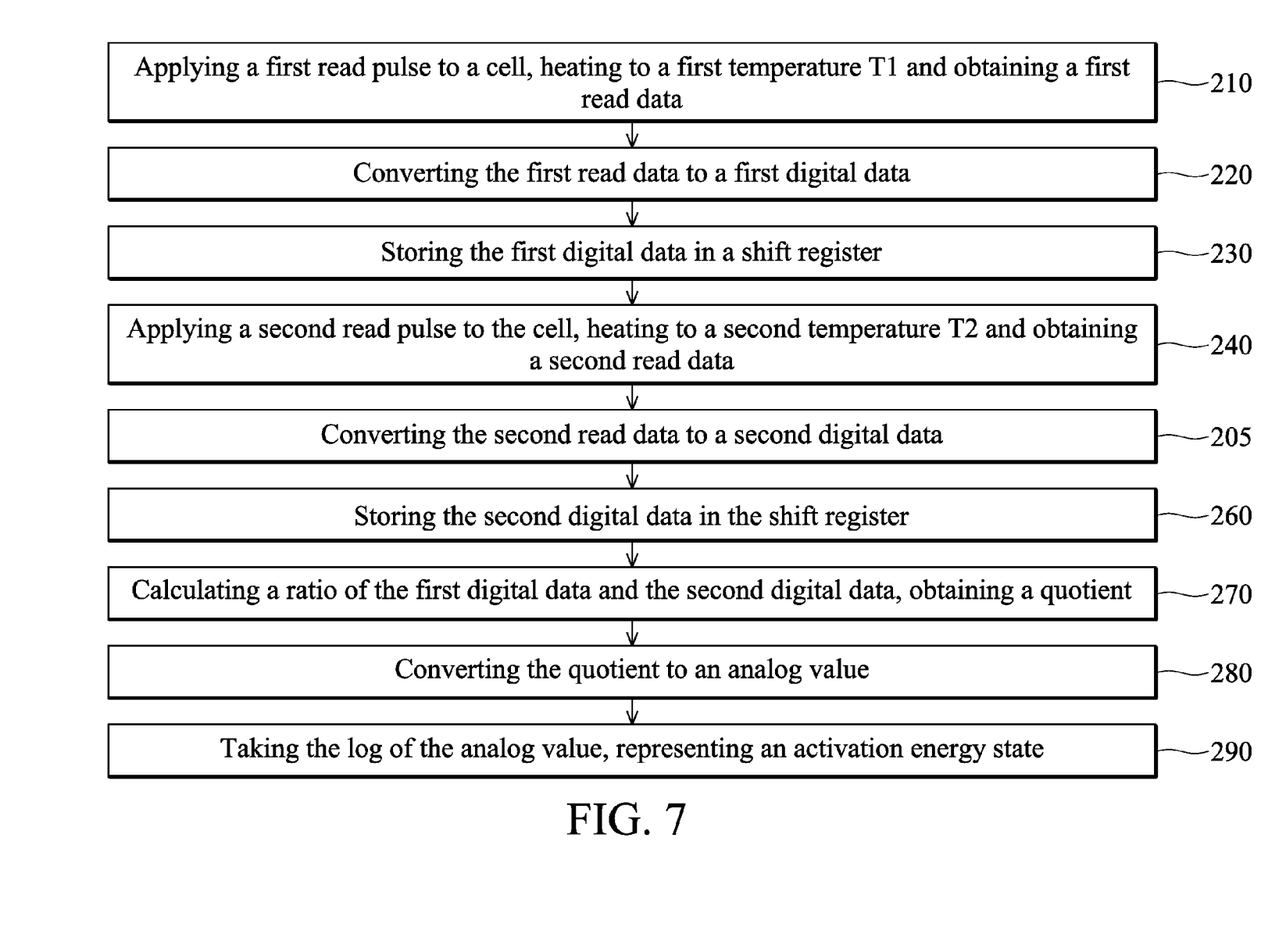
FIG. 7 shows a flow chart illustrating process steps according to the method of the invention.

In embodiments of the invention, the state information is characterized by the activation energy (Ea), which is determined by the ratio of two resistances, and read by two successive pulses, wherein each pulse designed to heat the cell to one of two different temperatures. The results of the two readings may be stored after analog-digital conversion in a shift register, and before a final readout/comparison of the results is performed. The comparison is the binary ratio of the digital data representing the two readings. For a given activation energy, the ratio will be unique, referenced to the ambient temperature. As shown in FIG. 7, the method for reading a memory cell of the invention includes applying a first read pulse to a memory cell to heat the memory cell to a first temperature $T_1$, thus obtaining a first data $R_1$ (as shown in step 210). Next, the first read data is converted to a first digital data via an analog-to-digital converter 30 (as shown in step 220). Next, the first digital data is stored in a shift register 40 (as shown in step 230). Next, a second read pulse is applied to the memory cell to heat the memory cell to a second temperature $T_2$, thus obtaining a second data $R_2$ (as shown in step 240). Particularly, the first temperature T1 and second temperature $T_2$ are different. Next, the second read data is converted to a second digital data via an analog-to-digital converter 30 (as shown in step 250). Next, the second digital data is stored in the shift register 40 (as shown in step 260). Next, the first digital data and the second digital data stored in the shift register 40 are provided to the arithmetic unit 70, calculating a ratio of the first digital data and the second digital data and obtaining a quotient (as shown in step 270). Next, the quotient is converted to an analog value via the digital-to-analog converter 80 (as shown in step 280). Finally, the log amplifier circuit 90 takes the log of the analog value, representing an activation energy state into a data unit 120 via a sense amplifier circuit 110 (as shown in step 290). The obtained activation energy state can be further calibrated with a thermal reference.

The memory cell read by the method of the invention can be a phase change memory cell, magnetic random access memory cell, or a resistive random access memory cell. The memory cell may include a switching device and a resistance device. The switching device may be realized with a MOS transistor or a diode, for example. The resistance device can include a phase change layer or an oxide resistance layer.

The particular structure of the phase change memory cell is not necessarily constrained, but it is preferably to have a cell that is relatively simple to fabricate and be programmed so that the amorphous and crystalline portions can be mixed in different proportions. For example, the structure may simply consist of a bottom electrode serving as a heater, with a layer of GST on top. The cell may be programmed by first applying a RESET pulse to melt a small portion of the GST, wherein some cooling time is allowed before a second pulse is applied for annealing some portions of the melted region back to a crystalline phase. Thus, a spectrum of different ratios of amorphous to crystalline material may be formed. Each ratio has a corresponding activation energy. In turn, the combination of different ratio regions present an overall effective activation energy. The activation energy can be read by the previously described algorithm.

Figure 8:
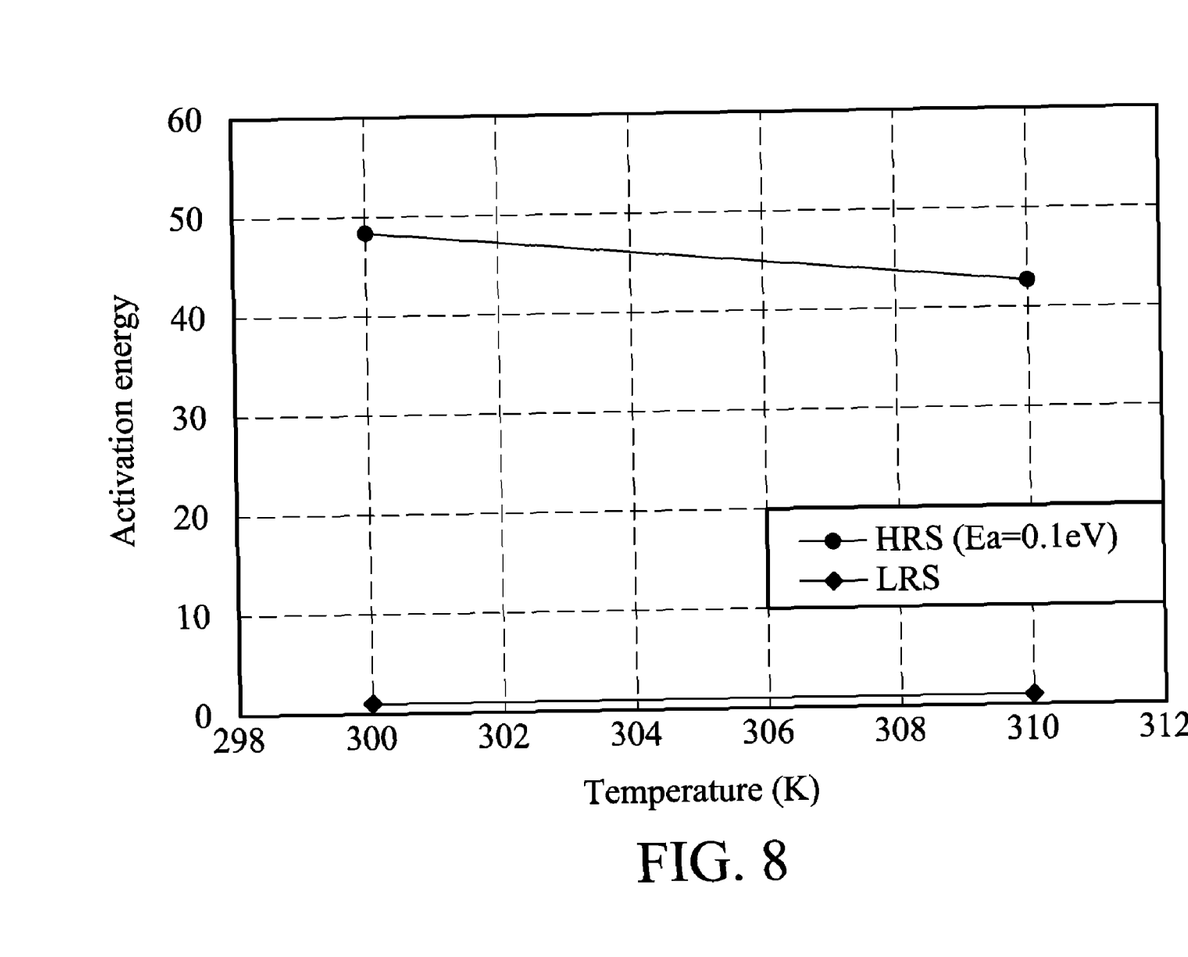
FIG. 8 shows a graph plotting resistance against time of the NiO resistive random access memory cell according to an embodiment of the invention.
Figure 9:
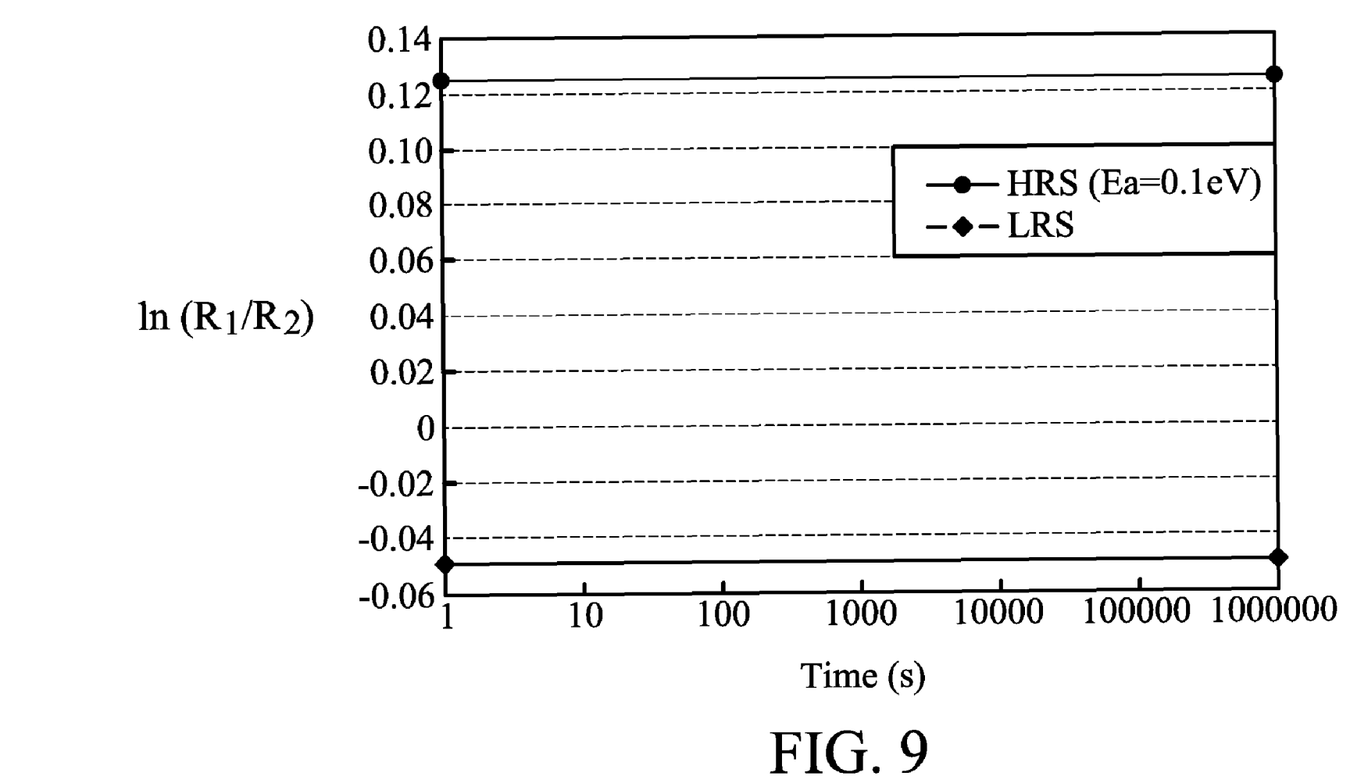
FIG. 9 shows a graph plotting the log ratio ($\ln(R1/R2)$) against time of the NiO resistive random access memory cell according to an embodiment of the invention.

A resistive random access memory cell has two main states i.e. high resistance state (HRS) and low resistance state (LRS). As shown in FIG. 8, the resistance state of the oxide resistance layer (here consisting of NiO) in the resistive random access memory cell according to an embodiment of the invention exhibit temperature dependences. As shown in FIG. 9, the $\ln(R_1/R_2)$ values (proportional to the activation energies) of the NiO resistive random access memory cell in the high resistance state is stable against time. Accordingly, the method for reading a memory cell of the invention can also be used for resistive random access memory cells.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for reading a memory cell, comprising:
   applying at least two successive read pulses to the memory cell, obtaining at least two read data; and
   storing the at least two read data in an arithmetic unit, and determining the activation energy via the at least two read data by a digital-to-analog converter and a log amplifier circuit.

2. The method as claimed in claim 1, wherein the at least two read pulses heat the memory cell to different temperatures.

3. The method as claimed in claim 1, wherein the memory cell comprises a phase change memory cell.

4. The method as claimed in claim 1, wherein the memory cell comprises a magnetic random access memory cell.

5. The method as claimed in claim 1, wherein the memory cell comprises a resistive random access memory cell.

6. The method as claimed in claim 1, wherein the memory cell comprises a multi-level memory cell.

7. A method for reading a memory cell, comprising:
   applying a first read pulse to the memory cell, heating the memory cell to a first temperature and obtaining a first read data;
   converting the first read data to a first digital data;
   storing the first digital data in an arithmetic unit;
   applying a second read pulse to the memory cell, heating the memory cell to a second temperature and obtaining a second read data;
   converting the second read data to a second digital data;
   storing the second digital data in the arithmetic unit;
   calculating a ratio of the first digital data and the second digital data by the arithmetic unit, obtaining a quotient;
   converting the quotient to an analog value; and
   taking the log of the analog value by a log amplifier circuit, representing an activation energy state.

8. The method as claimed in claim 7, further comprising:
calibrating the activation energy state with a thermal reference.

9. The method as claimed in claim 7, wherein the first temperature and the second temperature are different.

10. The method as claimed in claim 7, wherein the memory cell comprises a phase change memory cell.

11. The method as claimed in claim 7, wherein the memory cell comprises a magnetic random access memory cell.

12. The method as claimed in claim 7, wherein the memory cell comprises a resistive random access memory cell.

13. The method as claimed in claim 7, wherein the memory cell comprises a multi-level memory cell.

* * * * *